(12) United States Patent
Chen et al.

(10) Patent No.: US 8,238,062 B2
(45) Date of Patent: Aug. 7, 2012

(54) MAGNETORESISTIVE READER WITH DEMAGNETIZATION FLUX GUIDE

(75) Inventors: Yonghua Chen, Edina, MN (US); Jiaoming Qiu, Saint Paul, MN (US); Xilin Peng, Bloomington, MN (US); Kaizhong Gao, Eden Prairie, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 392 days.

(21) Appl. No.: 12/491,838

(22) Filed: Jun. 25, 2009

(65) Prior Publication Data

US 2010/0328823 A1 Dec. 30, 2010

(51) Int. Cl.
*G11B 5/39* (2006.01)

(52) U.S. Cl. .................................. 360/321; 360/319

(58) Field of Classification Search ............... 360/319, 360/321
See application file for complete search history.

(56) References Cited

U.S. PATENT DOCUMENTS

| | | | |
|---|---|---|---|
| 6,005,753 A | 12/1999 | Fontana, Jr. et al. | |
| 6,256,176 B1 | 7/2001 | Mao et al. | |
| 6,362,941 B1 | 3/2002 | Gill | |
| 6,381,107 B1 * | 4/2002 | Redon et al. | 360/324.2 |
| 6,385,016 B1 | 5/2002 | van Ek et al. | |
| 6,396,669 B1 | 5/2002 | Gill | |
| 6,411,478 B1 | 6/2002 | Mao et al. | |
| 6,556,392 B1 | 4/2003 | Mao et al. | |
| 6,738,236 B1 | 5/2004 | Mao et al. | |
| 6,738,237 B2 | 5/2004 | Gill | |
| 6,791,806 B1 | 9/2004 | Gao et al. | |
| 6,867,953 B2 | 3/2005 | Gill | |
| 6,914,759 B2 | 7/2005 | Chen et al. | |
| 7,313,856 B2 | 1/2008 | Gill | |
| 7,362,547 B2 | 4/2008 | Freitag et al. | |
| 7,826,179 B2 * | 11/2010 | Shimazawa et al. | 360/319 |
| 7,876,534 B2 * | 1/2011 | Chou et al. | 360/319 |
| 2007/0146939 A1 | 6/2007 | Pinarbasi | |
| 2007/0188940 A1 | 8/2007 | Beach et al. | |
| 2007/0217080 A1 | 9/2007 | Jayasekara et al. | |

* cited by examiner

*Primary Examiner* — Allen Heinz (74) *Attorney, Agent, or Firm* — Hall Estill Attorneys at Law (57) ABSTRACT

In some embodiments, a magnetic reader comprises first and second shields extending from an air bearing surface (ABS), a magnetoresistive stack is located between the first and second shields, and a flux guide is separated from the magnetoresistive stack while connecting the first and second shields. The flux guide magnetically couples the distal end of the magnetoresistive stack to the first shield.

20 Claims, 7 Drawing Sheets

MAGNETORESISTIVE READER WITH DEMAGNETIZATION FLUX GUIDE

SUMMARY

This invention is generally directed to a magnetic reader. The reader comprises a magnetoresistive (MR) stack located between first and second shields. The MR stack extends from an air bearing surface (ABS). A demagnetization flux guide is separated from magnetoresistive stack and connects the first shield and the second shield. The flux guide magnetically couples the distal end of the MR stack to the first shield.

DETAILED DESCRIPTION

Figure 1:
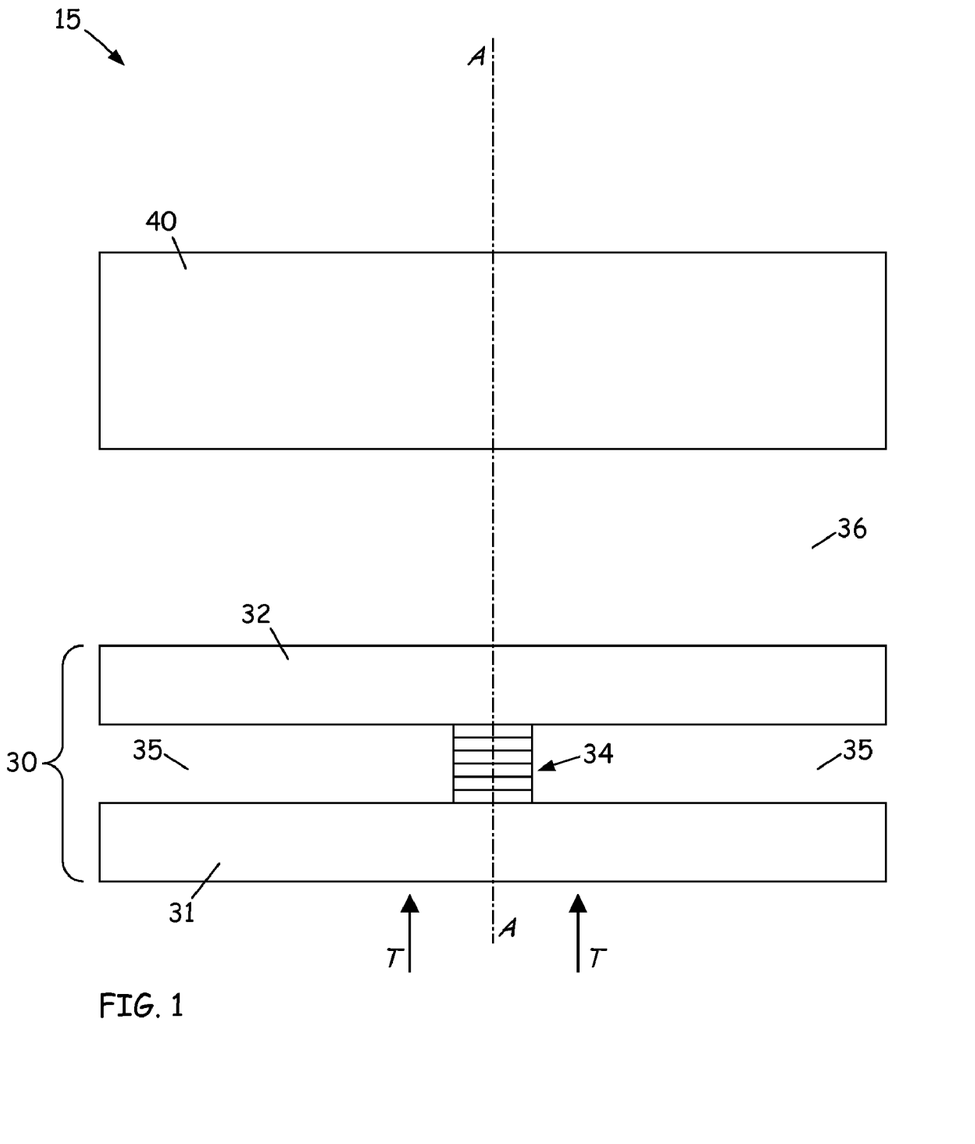
FIG. 1 is an external surface view of a magnetic transducer having a reader with an MR stack.

FIG. 1 is an external or media-facing surface view of magnetic transducer 15 with reader 30 and writer 40. Transducer 15 is oriented about center axis A, along media tracking direction T.

Figure 2:
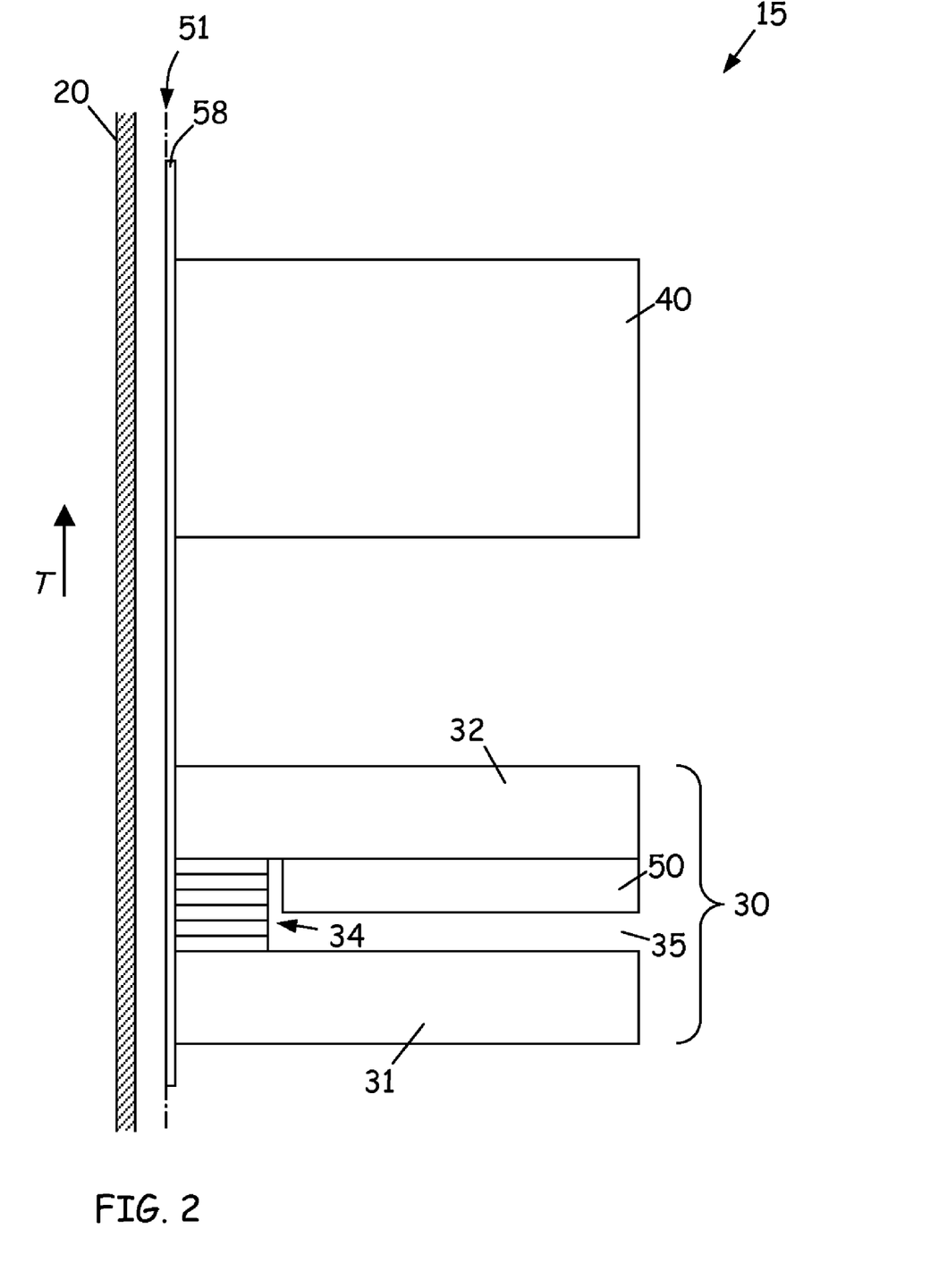
FIG. 2 is a cross-sectional view of the magnetic transducer in FIG. 1, showing the MR stack with demagnetization flux guide.

Reader 30 and writer 40 are formed as a number of closely spaced layers, for example by thin film deposition on a slider or other substrate material. In the particular embodiment of FIG. 1, reader 30 comprises first read shield 31, second read shield 32 and MR stack (or MR sensor) 34. Typically, first shield 31 is formed as a bottom shield and second shield 32 is formed a top shield, as shown in FIG. 2, but this designation is arbitrary. In other embodiments, first shield 31 is a top shield and second shield 32 is a bottom shield, depending upon the orientation of MR stack 34 and the other components of reader 30.

MR stack 34 comprises a multilayer magnetoresistive stack or spin valve, which extends along tracking direction T between first (bottom) read shield 31 and second (top) read shield 32. Nonmagnetic insulator (read gap material) 35 comprises a dielectric such as alumina (aluminum oxide, or $Al_2O_3$), and extends between first and second read shields 31 and 32.

As shown in FIG. 1, writer 40 is separated from reader 30 by an additional layer of dielectric insulator 36, with reader 30 and writer 40 configured for perpendicular data storage operations. Alternatively, transducer 15 utilizes a merged head design in which top read shield 32 also functions as a bottom shield for writer 40. In further embodiments, reader 30 and writer 40 are configured either for perpendicular or longitudinal read and write operations.

Bit density scales with the physical dimensions of reader 30 and writer 40, particularly MR stack 34. Unfortunately, reduced stack dimensions are associated with increased demagnetization effects, as described above, which tend to limit reader sensitivity and the physically attainable density. To address this concern, reader 30 is provided with a demagnetization flux guide to direct stray (demagnetization) flux away from MR stack 34, increasing reader sensitivity and providing for higher areal densities and reduced reader dimensions.

FIG. 2 is a cross-sectional view of magnetic transducer 15, taken along center axis A of FIG. 1. Magnetic transducer 15 comprises reader 30 and writer 40. Reader 30 and writer 40 are positioned to perform data storage operations on magnetic medium 20, which translates in tracking direction T with respect to external (media-facing) surface 51 of transducer 15.

Reader 30 comprises first read shield 31, second read shield 32 and MR stack 34, as described above, with flux guide 50 to reduce demagnetization effects. In the embodiment of FIG. 2, the layers of MR stack 34 are oriented transversely to media-facing surface 51, and generally parallel to first and second read shields 31 and 32. Flux guide 50 extends from second (top) read shield 32 toward first (bottom) read shield 31, and is spaced from the distal end of MR stack 34 (opposite media-facing surface 51) by read gap material 35.

In some embodiments, reader 30 and writer 40 are provided with protective coating 58 at external surface 51. Typical protective coatings include encapsulants, diamond-like coatings (DLCs) and combination thereof, which protect magnetic transducer 15 and prevent hard particle contamination of magnetic medium 20.

In operation of transducer 15, magnetic medium 20 translates in tracking direction T with respect to media-facing surface 51. Writer 40 generates magnetic flux loops that cross media-facing surface 51 into data storage medium 20, in order to lay down a sequential bit pattern.

Reader 30 decodes the bit pattern as a function of a sense current across MR stack 34, where the sense current varies with the external field strength along media-facing surface 51 (that is, with the magnetic domains in the bit pattern). First and second read shields 31 and 32 shield MR stack 34 from stray flux, improving sensitivity to smaller bit patterns and increasing the attainable bit density.

As bit size decreases, however, reader 30 and writer 40 are subject to additional dimensional constraints. With particular respect to MR stack 34, reduced layer thickness increases field overlap and demagnetization effects, ultimately limiting the attainable areal density. Flux guide 50 addresses this issue by directing demagnetization flux away from MR stack 34, providing for smaller stack dimensions without sacrificing reader sensitivity.

Figure 3A:
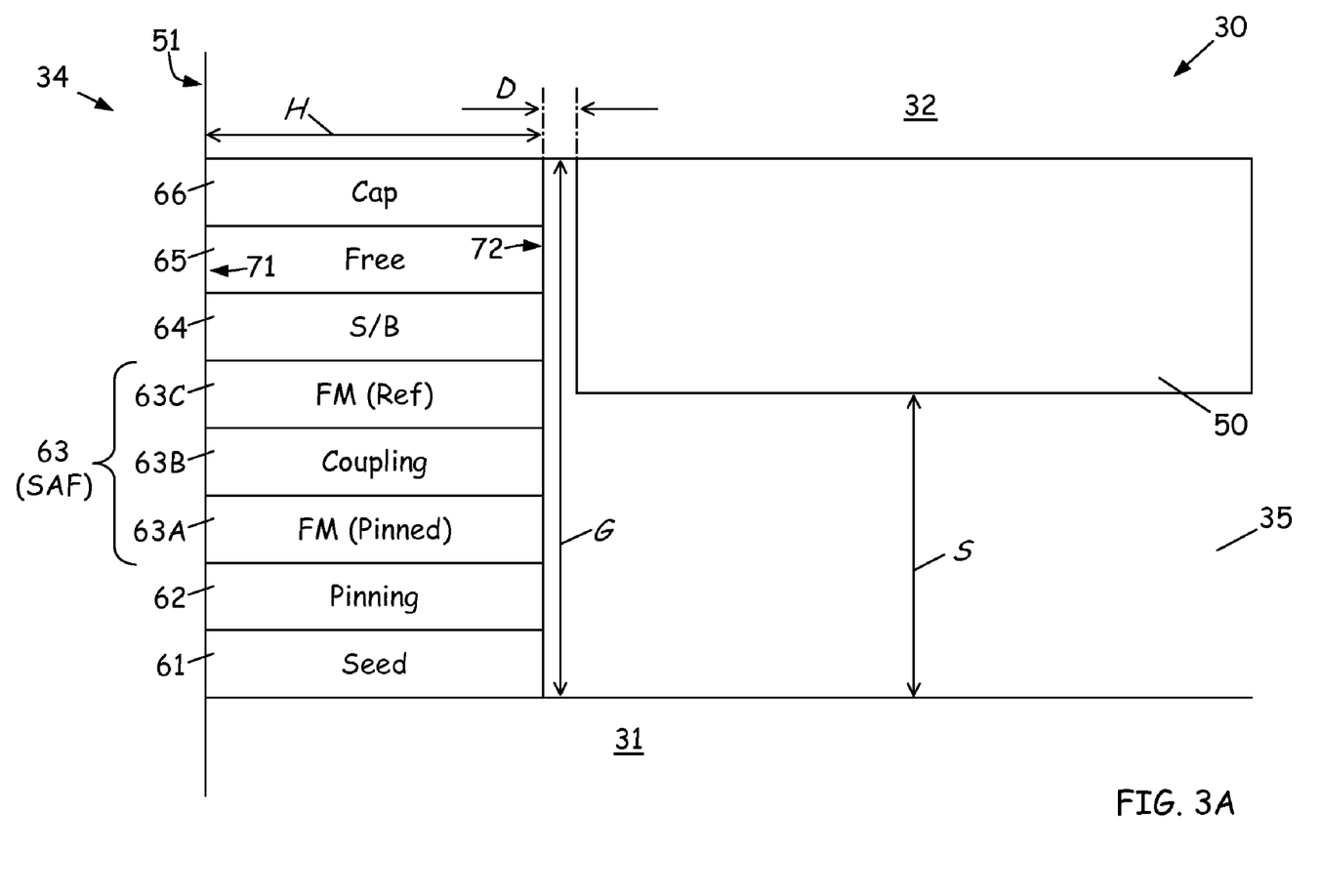
FIG. 3A is a cross-sectional view of the MR stack in FIG. 2, in a current-perpendicular to plane (CPP) embodiment with a synthetic antiferromagnetic (SAF) reference layer structure.
Figure 3B:
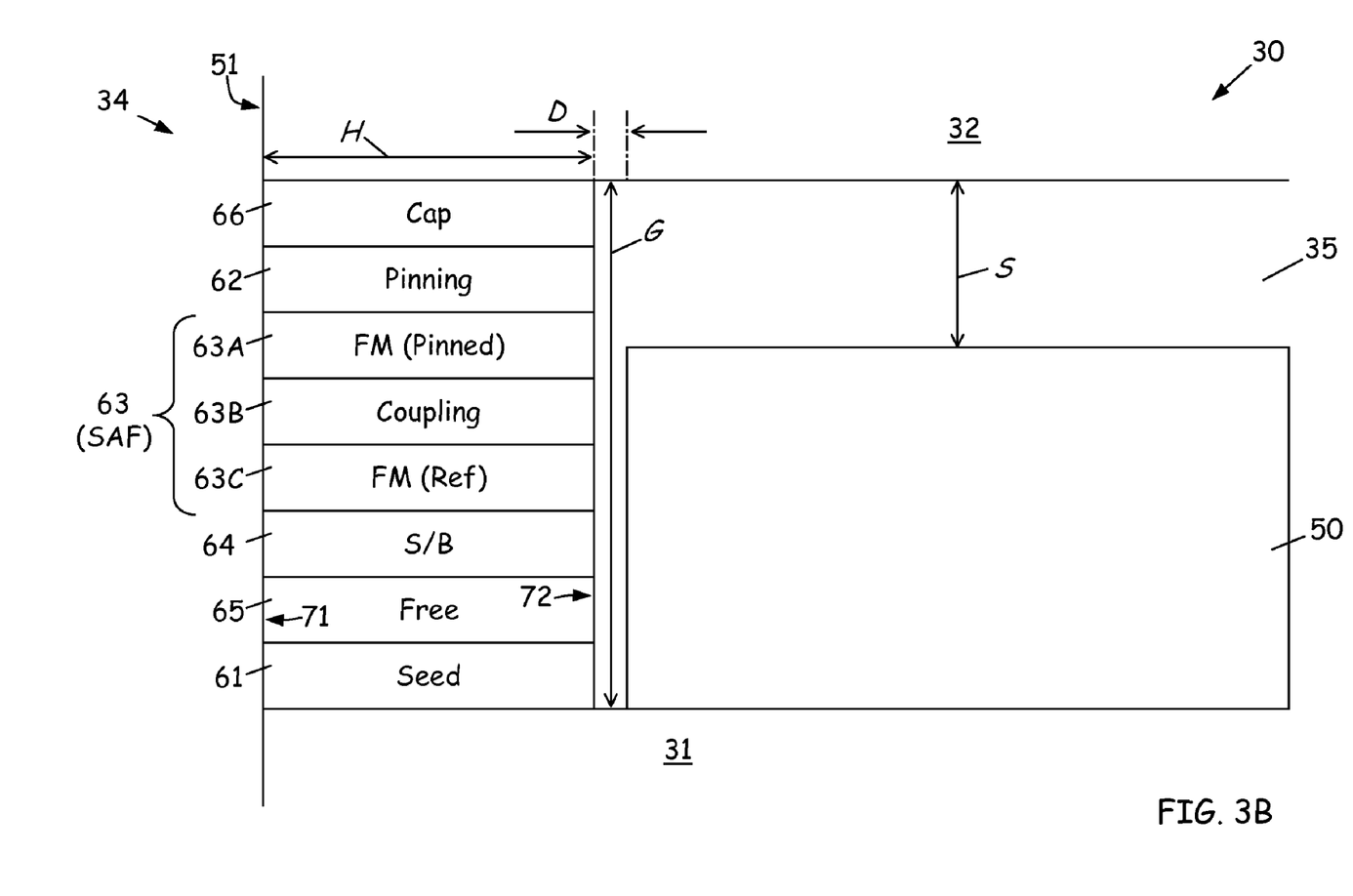
FIG. 3B is an alternate cross-sectional view of the MR stack in FIG. 3A, in a CPP embodiment having a different stack orientation and flux guide configuration.

FIGS. 3A and 3B are cross-sectional views of reader 30 with demagnetization flux guide 50, in current-perpendicular-to-plane (CPP) embodiments having a synthetic antiferromagnetic (SAF) reference layer structure. In these embodiments, MR stack 34 is formed as a multilayer MR stack comprising seed layer 61, pinning layer 62, multilayer SAF structure 63, spacer/barrier layer 64, free layer 65 and cap layer 66. Multilayer SAF 63 comprises ferromagnetic (FM) pinned layer 63A, coupling layer 63B and FM reference layer 63C.

First and second read shields 31 and 32 extend transversely to media-facing surface 51, separated by MR stack 34 and read gap material 35. MR stack 34 is located between first and second read shields 31 and 32, with proximal (media-facing) end 71 oriented toward media-facing surface 51 and distal (opposite) end 72 oriented away from media-facing surface 51.

In the embodiment of FIG. 3A, demagnetization flux guide 50 is coupled to second (top) shield 32 and extends downward past free layer 65 toward FM reference layer 63C of SAF 63. In the embodiment of FIG. 3B, demagnetization flux guide 50 is coupled to second (bottom) shield 31 and the orientations of MR stack 34 and SAF 63 are reversed, such that flux guide 50 extends upward past free layer 65 toward FM (pinned) layer 63A.

Stripe height H is measured from proximal end 71 to distal end 72 of MR stack 34. Read gap G is measured along the tracking direction, between first shield 31 and second shield 32.

In compact bit spacing configurations, read gap G is limited to a particular width, for example about 100 nm or less. In some of these embodiments, read gap G is limited to about 50 nm or less, and in additional embodiments read gap G is limited to about 30 nm or less. In these dimensional ranges, MR stack 34 is subject to substantial demagnetization field effects, which are addressed via demagnetization flux guide 50.

Flux guide 50 and shields 31 and 32 are typically formed of a soft magnetic material such as NiFe, CoFe or a similar soft magnetic alloy. In some embodiments, flux guide 50 and one or both of read shields 31 and 32 are formed of the same magnetic material, in order to improve flux coupling and field uniformity, or to reduce manufacturing requirements. Alternatively, different magnetic materials are used, for example to provide field shaping.

Flux guide 50 is spaced from MR stack 34 by distal flux gap D at stripe height H, and extends along distal end 72 in order to magnetically couple MR stack 34 to one of shields 31 and 32. Flux guide 50 also extends transversely with respect to media-facing surface 51 along one of read shields 31 or 32, and across a portion of read gap G such that flux guide 50 is spaced from the opposite shield by shield gap S.

In the particular embodiments of FIGS. 3A and 3B, distal gap D ranges from about two to about twenty nanometers (2-20 nm) and shield gap S ranges from about 15-40 nm. These dimensions vary, however, depending on the configuration of MR stack 34 and shields 31 and 32, and on the particular manufacturing steps used to form reader 30. In some embodiments, for example, gaps D and S are formed by chemical vapor deposition (CVD) of nonmagnetic insulator 35, combined with masking, etching and milling of the gap and adjacent structures. In other embodiments, flux gaps D and S are formed using additional techniques such as thin-film deposition or atomic layer deposition (ALD).

In ALD embodiments, the microscopic structure of the flux gap material is defined by a gas phase chemical process in which individual precursors (that is, the molecular components of read gap material 35) are sequentially deposited as a series of monolayer structures formed by self-limiting surface reactions. The ALD process results in conformal flux gap structures that are substantially free of pin holes and other defects, with the gap material chemically bonded to other reader components such as shields 31 and 32, flux guide 50 and MR stack 34 (at distal end 72). The ALD process also improves gap uniformity, with thickness tolerances on the order of 1 nm or less for both distal flux gap D and shield flux gap S.

Seed layer 61 and cap layer 66 are generally formed of materials selected to reduce magnetic couplings between MR stack 34 and first and second read shields 31 and 32, for example Cu, Ni, Fe, Cr, P, Ta and combinations thereof, including NiFe, NiFeCr, Ta/NiFe and NiCrFe/NiFe alloys. The material of seed layer 61 is also selected to enhance the crystallographic structure of the additional layers in MR stack 34, particularly the grain structure, grain size and domain orientation in pinning layer 62.

Pinning layer 62 is deposited adjacent seed layer 61, and is typically formed of a material having a permanent magnetic moment sufficient to pin or fix magnetic orientations within SAF 63. In particular, pinning layer 62 is magnetically coupled to pinned layer 63A, which in turn determines the magnetic orientation of reference layer 63C. Suitable materials for pinning layer 62 include magnetic alloys such as CoPt and CoPtCr, or antiferromagnetic (AFM) materials such as PtMn, MiMn or FeMn.

Pinned layer 63A and reference layer 63C of SAF 63 are typically comprised of ferromagnetic materials such as Fe, NiFe or CoFe, such that the magnetization of pinned layer 63A is determined by ferromagnetic coupling to pinning layer 62. Coupling layer 63B is formed of a non-ferromagnetic material such as Ru, which promotes exchange coupling such that reference layer 63C is antiferromagnetically coupled to pinned layer 63A, and the magnetization of reference layer 63C is oriented oppositely to that of pinned layer 63A.

Free layer 65 is typically formed of a ferromagnetic material in which the magnetic orientation is responsive to an external field across media-facing surface 51, and the resistivity of MR stack varies with the magnetic orientation of free layer 65 as compared to reference layer 63C. This allows reader 30 to read back bit patterns as a function of a sense current that depends on the resistivity of MR stack 34. In GMR embodiments, for example, spacer/barrier layer 64 is formed of a nonmagnetic conductor or spacer, and the sense current across MR stack 34 depends on the giant magnetoresistive effect.

In tunneling (TMR) embodiments, spacer/barrier layer 64 is formed of an insulating tunnel barrier material, and the sense current is a tunneling current. In these TMR embodiments, suitable materials for spacer/barrier layer 64 include dielectric oxides of Al, Mg, Hf, Ta, Nd, Ti or Zr, and combinations thereof.

In the CPP embodiments of MR stack 34 illustrated by FIGS. 3A and 3B, read shields 31 and 32 are typically formed of conducting magnetic materials and also function as electrical contacts for conducting the sense current MR stack 34. In these embodiments, the sense current flows substantially perpendicularly to the layers of MR stack 34, and MR stack 34 extends across substantially all of read gap G, from first read shield 31 to second read shield 32.

In current-in-plane (CIP) embodiments, the sense current contacts are formed on either side of MR stack 34 (that is, on the left and right in FIG. 1), and the sense current flows substantially parallel to the individual layers of MR stack 34. In these embodiments, MR stack 34 is typically spaced from top and bottom read shields 31 and 32 by additional read gap material 35.

The magnetic field orientations within individual layers of MR stack 34 depend on the detailed arrangement of seed layer 61, pinning layer 62, SAF layers 63A, 63B and 63C, spacer/barrier layer 64, free layer 65 and cap layer 66. Typically, individual magnetic orientations are either into or out of (that is, perpendicular to) the planar structure of MR stack 34, but longitudinal magnetic fields are also produced for biasing and other purposes, and surface and edge magnetization effects must also be taken into account.

Magnetic flux lines, moreover, are not constrained to remain within particular layers of MR stack 34, but tend to diverge and stray across layer boundaries, generating both longitudinal and perpendicular demagnetization field components, for example in free layer 65 and along the sides and distal end 72 of MR stack 34. These demagnetization fields tend to increase hysteresis, increasing response time and reducing the angular difference in magnetization direction in free layer 65 with respect to reference layer 63C.

As the dimensions of reader 30 and MR stack 34 are reduced to accommodate higher bit densities, moreover, demagnetization effects increase, further decreasing sensitivity and response. Flux guide 50 limits these demagnetization effects by directing stray flux away from MR stack 34. In particular, flux guide 50 directs demagnetization flux away from distal end 72 of free layer 65, reducing hysteresis and increasing the response of free layer 65.

The configuration of flux guide 50 varies with the corresponding configuration of MR stack 34 and the other elements of reader 30. In some embodiments, for example, flux guide 50 extends from top read shield 32 toward bottom shield 31, as shown in FIG. 3A, and in other embodiments flux guide 50 extends from bottom read shield 31 toward top shield 32. Further, flux guide 50 sometimes extends past free layer 65 to spacer/barrier layer 64 or reference layer 63C, as shown in FIG. 3A, or to a component of SAF 63 such as pinned layer 63A, as shown in FIG. 3B or even past SAF 63 to pinning layer 62.

Figure 4:
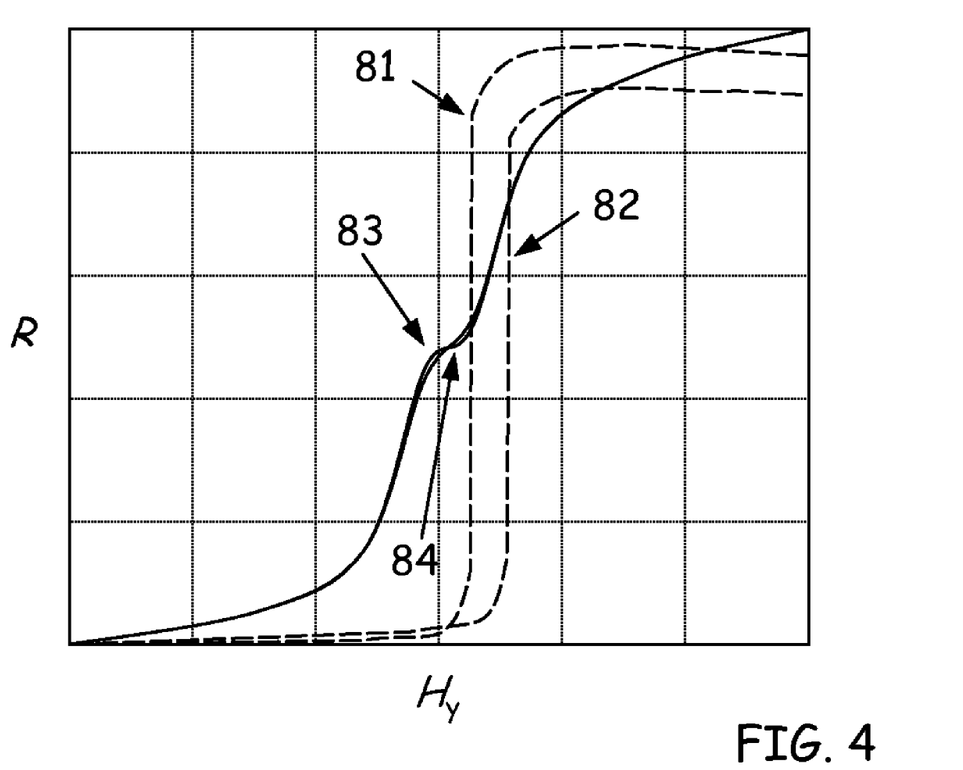
FIG. 4 is a plot of representative hysteresis curves for the reader in FIG. 2, as compared to a baseline design without a demagnetization flux guide.

FIG. 4 is a plot of representative hysteresis curves for MR stack 34, as shown in any of FIGS. 3A and 3B, above, or in FIGS. 5A and 5B, below. Effective resistance R is plotted on the vertical axis and effective field $H_y$ on the horizontal, as compared to a baseline design without the demagnetization flux guide. Both axes are unscaled.

Curves 81 and 82 (dashed) are forward and backward hysteresis curves, respectively, for the baseline design, and curves 83 and 84 (solid) are obtained after adding a demagnetization flux guide. The hysteresis area between baseline curves 81 and 82 is substantial, demonstrating demagnetization effects. In particular, demagnetization fields reduce sensitivity by requiring a greater change in effective field $H_y$ before a commensurate change in effective resistance R is observed (that is, before the sense current changes). Baseline response curves 81 and 82 are also history-dependent, in that the transition point (in effective field $H_y$) depends not only upon the field strength but also prior magnetic history and field polarity. As a result. In addition the sense current is less responsive to changes in external magnetic fields, and the reader is less sensitive to higher-density bit patterns and smaller field gradients.

Curves 83 and 84, on the other hand, show that the demagnetization flux guide substantially limits hysteresis effects by reducing the demagnetization fields. In particular, hysteresis curves 83 and 84 exhibit a smoother, more continuous transition from low to high resistivity, with improved linearity and reduced free layer rotation. As a result, effective resistance R for curves 83 and 84 is substantially independent of field polarity and prior field excursions, the sense current is more responsive to changes in the external magnetic field, and the MR stack exhibits improved sensitivity to higher-density bit patterns and smaller field gradients.

Figure 5A:
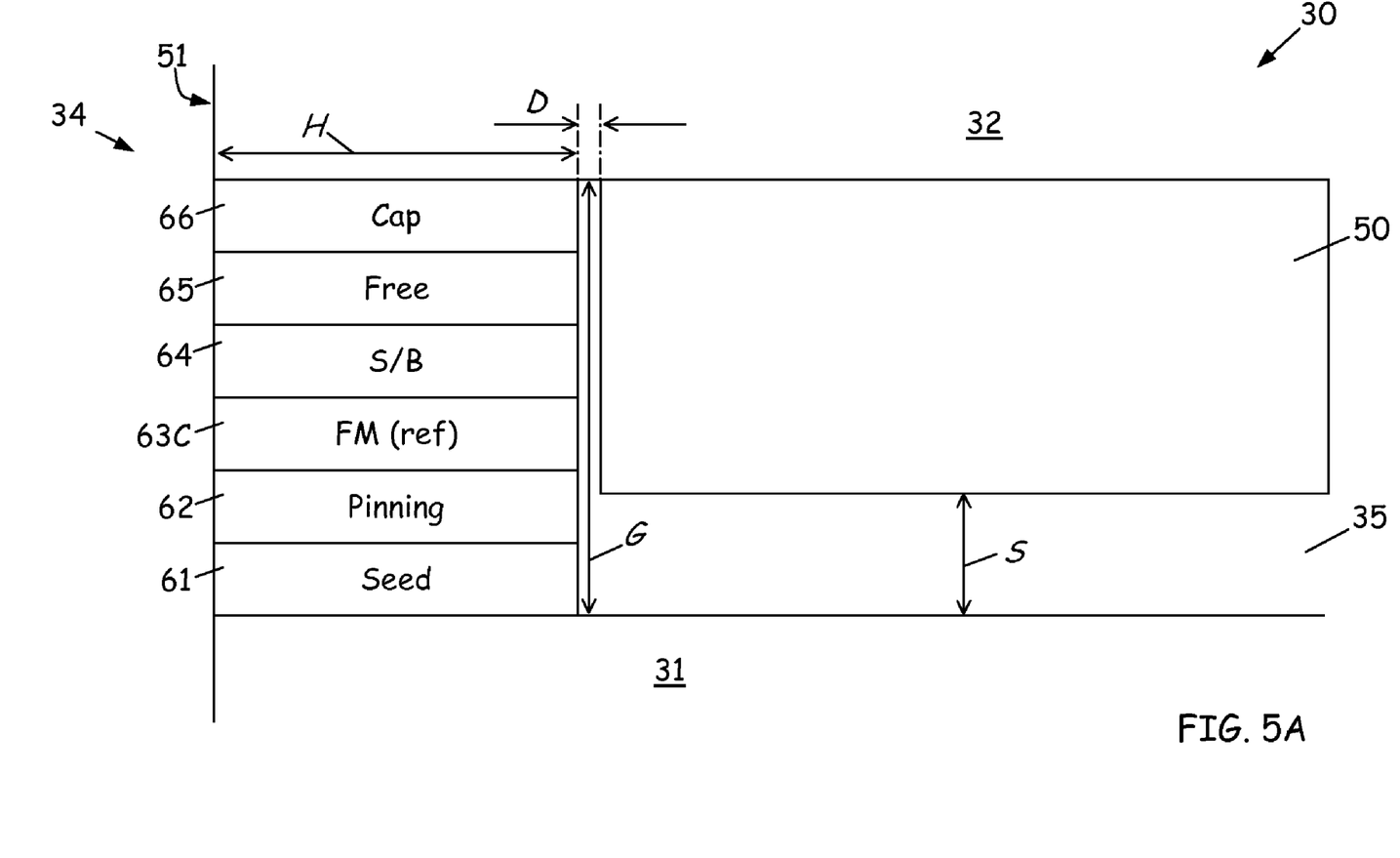
FIG. 5A is a cross-sectional view of the MR stack in FIG. 2, in a CPP embodiment with a single-layer ferromagnetic (FM) reference layer.
Figure 5B:
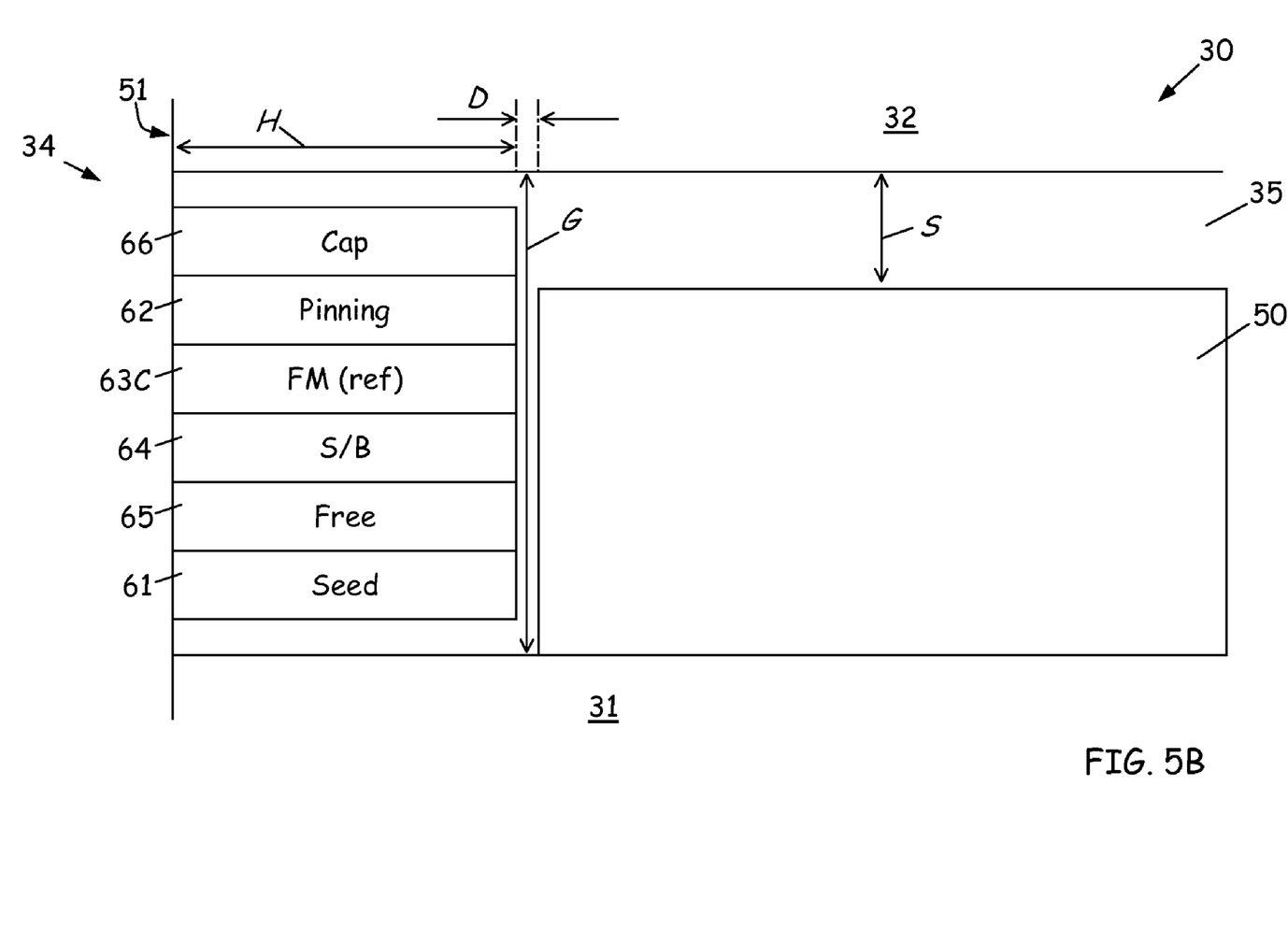
FIG. 5B is an alternate cross-sectional view of the MR stack in FIG. 5A.

FIGS. 5A and 5B are alternate cross-sectional views of reader 30 with demagnetization flux guide 50. In the configuration of FIG. 5A, MR stack 34 extends across read gap 35 from bottom shield 31 to top shield 32. In the configuration of FIG. 5B, MR stack 34 is spaced from shields 31 and 32 by additional read gap material.

MR stack 34 comprises seed layer 61, pinning layer 62, reference layer 63C, spacer/barrier layer 64, free layer 65 and cap layer 66, as described above. In these embodiments, however, the multilayer SAF structure is replaced by a single ferromagnetic (FM) reference layer 63C, which is directly ferromagnetically coupled to pinning layer 62, rather than antiferromagnetically coupled to pinned layer 63A via coupling layer 63B as shown in FIGS. 3A and 3B, above.

The single-layer FM reference layer structure of FIGS. 5A and 5B reduces the number of elements (layers) in MR stack 34, reducing reader size and providing for additional increases in areal density with lower manufacturing costs. This contrasts with existing designs, in which a larger SAF structure is required to fix the reference layer orientation and ensure reader sensitivity.

In the particular embodiments of FIGS. 5A and 5B, distal gap D is reduced from about 2-20 nm to about 2-10 nm or less, typically to about 5 nm or less. Shield gap S is similarly reduced, from about 15-40 nm to about 5-20 nm or less, typically to about 5-10 nm. Depending on embodiment, this provides greater flux coupling between MR stack 34 and flux guide 50, further reducing the demagnetization fields and hysteresis effects, and further improving response to small bit patterns and low field gradients.

While this invention has been described with reference to particular embodiments, the terminology used is for the purposes of description, not limitation. Workers skilled in the art will recognize that changes may be made in form and detail without departing from the spirit and scope of the invention, including the substitution of various equivalents for particular invention elements and adaptation of the invention's teachings to different materials, situations and circumstances. Thus the invention is not limited to the particular embodiments disclosed herein, but encompasses all embodiments falling within the scope of the appended claims.

The invention claimed is:

1. A magnetic reader comprising:
a magnetoresistive stack disposed between first and second shields on an air bearing surface (ABS), the first shield constructed of a first material; and
a flux guide constructed of a second material, different from the first material, the flux connected to the first shield while separated from the second shield and magnetoresistive stack distal the ABS, the flux guide extending from the first shield to be laterally adjacent a free layer of the magnetoresistive stack without being laterally adjacent a pinning layer of the magnetoresistive stack, the flux guide configured to magnetically couple the magnetoresistive stack to at least the first shield.

2. The magnetic reader of claim 1, wherein the magnetoresistive stack has a current perpendicular to plane, such that a resistivity of the magnetoresistive stack depends upon a magnetic orientation of the free layer with respect to a magnetic orientation of the reference layer.

3. The magnetic reader of claim 2, wherein the magnetoresistive stack comprises a multilayer synthetic antiferromagnetic structure, and wherein the multilayer synthetic antiferromagnetic structure comprises the reference layer.

4. The magnetic reader of claim 2, wherein the magnetoresistive stack comprises a single-layer ferromagnetic reference layer ferromagnetically coupled to the pinning layer.

5. The magnetic reader of claim 2, wherein the magnetoresistive stack comprises a cap layer adjacent the first shield and a spacer or barrier layer between the free layer and the reference layer, and wherein the flux guide extends past the cap layer and the free layer at least to the spacer or barrier layer.

6. The magnetic reader of claim 2 wherein the magnetoresistive stack comprises a seed layer adjacent the first shield and a spacer or barrier layer between the free layer and the reference layer, and wherein the flux guide extends past the seed layer and the free layer at least to the spacer or barrier layer.

7. The magnetic reader of claim 1, wherein a read gap defined between the first and second shields is about 50 nm or less.

8. The magnetic reader of claim 7, wherein the flux guide is spaced from the distal end of the magnetoresistive stack by about 2 nm to about 5 nm.

9. The magnetic reader of claim 8, wherein the flux guide extends from the second shield toward the first shield such that the flux guide is spaced from the first shield by about 5 nm to about 10 nm.

10. The magnetic reader of claim 1, wherein the flux guide comprises NiFe, CoFe or other soft magnetic materials.

11. The magnetoresistive device of claim 1, wherein the magnetic material is spaced from the free layer by a nonmagnetic gap material having a thickness of about 5 nm or less.

12. The magnetoresistive device of claim 1, wherein the first material is capable of conducting a sense current perpendicularly to a plane of the free layer and perpendicularly to a plane of the reference layer.

13. The magnetoresistive device of claim 1, wherein the reference layer comprises a single-layer ferromagnetic structure and is ferromagnetically coupled to the pinning layer in order to fix the fixed field orientation with respect to the external magnetic field.

14. A magnetic transducer comprising:
 a writer and reader oriented toward an air bearing surface (ABS), the reader comprising:
  a magnetoresistive stack disposed between first and second read shields extending from the ABS, the first read shield made of a first material; and
  a demagnetization flux guide made of a second material, different from the first material, and connected to the second read shield and separated from the magnetoresistive stack and the first read shield by a nonmagnetic insulator, the demagnetization flux guide extending from the second read shield to be adjacent less than all the magnetoresistive stack.

15. The magnetic transducer of claim 14, wherein the spin valve comprises a free layer having a free field orientation and a reference layer having a fixed field orientation, and wherein a resistivity of the spin valve depends on a relative orientation of the free field orientation and the fixed field orientation.

16. The magnetic transducer of claim 15, wherein the spin valve comprises a pinning layer and wherein the fixed field orientation of the reference layer is fixed by direct ferromagnetic coupling to the pinning layer.

17. The magnetic transducer of claim 14, wherein the nonmagnetic insulator spaces the demagnetization flux guide from the spin valve by a first distance and spaces the demagnetization flux guide from the second read shield by a second distance, the second distance being greater than the first distance.

18. The magnetic transducer of claim 17, wherein the nonmagnetic insulator comprises a thin film of aluminum oxide.

19. A magnetoresistive device comprising:
 a magnetically responsive free layer separated from a reference layer by a spacer layer, the reference layer having a fixed field orientation due to contact with a pinning layer;
 first and second shields for shielding the free layer from stray magnetic flux, the first shield formed of a first material; and
 a magnetic material, different from the first material, connected to the first shield extending adjacent the free layer to conduct demagnetization flux, the magnetic material separated from the free layer and reference layer without extending behind the pinning layer.

20. The magnetoresistive device of claim 19, wherein the magnetic material continuously extends from the shield past the free layer and to the reference layer, such that the magnetic material directs demagnetization flux away from the reference layer.

* * * * *